(12) United States Patent
Cok et al.

(10) Patent No.: US 9,213,139 B2
(45) Date of Patent: Dec. 15, 2015

(54) IMPRINTED MULTI-LEVEL OPTICAL CIRCUIT STRUCTURE METHOD

(71) Applicants: Ronald Steven Cok, Rochester, NY (US); Todd Mathew Spath, Hilton, NY (US)

(72) Inventors: Ronald Steven Cok, Rochester, NY (US); Todd Mathew Spath, Hilton, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/097,812

(22) Filed: Dec. 5, 2013

(65) Prior Publication Data

US 2015/0160414 A1  Jun. 11, 2015

(51) Int. Cl.
| | | |
|---|---|---|
| H01L 31/12 | (2006.01) | |
| H01L 31/18 | (2006.01) | |
| G02B 6/13 | (2006.01) | |
| G02B 6/122 | (2006.01) | |
| H05K 3/12 | (2006.01) | |
| H01L 23/538 | (2006.01) | |
| H01L 21/768 | (2006.01) | |
| G02B 6/42 | (2006.01) | |
| G06F 3/044 | (2006.01) | |
| H05K 3/32 | (2006.01) | |
| G02B 6/12 | (2006.01) | |

(52) U.S. Cl.
CPC *G02B 6/122* (2013.01); *G02B 6/13* (2013.01); *G02B 6/4214* (2013.01); *G02B 6/4274* (2013.01); *H01L 21/76895* (2013.01); *H01L 23/5386* (2013.01); *H01L 31/12* (2013.01); *H01L 31/18* (2013.01); *H05K 3/1258* (2013.01); *G02B 2006/121* (2013.01); *G02B 2006/12104* (2013.01); *G02B 2006/12126* (2013.01); *G02B 2006/12147* (2013.01); *G06F 3/044* (2013.01); *H05K 3/32* (2013.01); *H05K 2201/0108* (2013.01); *H05K 2201/09036* (2013.01); *H05K 2201/10356* (2013.01); *H05K 2203/0108* (2013.01)

(58) Field of Classification Search
CPC ........... H01L 25/167; G09G 2360/142; G09G 2370/18; H05K 3/1258; H05K 3/465
See application file for complete search history.

(56) References Cited

U.S. PATENT DOCUMENTS

| | | |
|---|---|---|
| 6,320,863 B1 | 11/2001 | Ramfelt et al. |
| 6,755,573 B2 | 6/2004 | Hoffmann et al. |
| 8,437,085 B1 | 5/2013 | Zhovnirovsky et al. |
| 2007/0207297 A1* | 9/2007 | Lee et al. ...................... 428/209 |
| 2008/0079183 A1 | 4/2008 | Lee et al. |
| 2012/0212465 A1* | 8/2012 | White et al. .................. 345/205 |

* cited by examiner

Primary Examiner — Khaja Ahmad
(74) Attorney, Agent, or Firm — Raymond L. Owens

(57) ABSTRACT

A method of making an imprinted optical micro-channel structure for transmitting light to an optical receiver or receiving light from an optical transmitter includes forming a curable optical layer over a substrate and imprinting one or more optical micro-channels in the optical layer with a first stamp. The curable optical layer is cured to form a cured optical layer having the optical micro-channels imprinted in the cured optical layer. A curable light-transparent material is located in the optical micro-channels and cured to form light-pipes of cured light-transparent material in the optical micro-channels. The optical transmitter located in alignment with a light-pipe for transmitting light through the light-pipe or the optical receiver is located in alignment with a light-pipe for receiving light from the light-pipe.

16 Claims, 15 Drawing Sheets

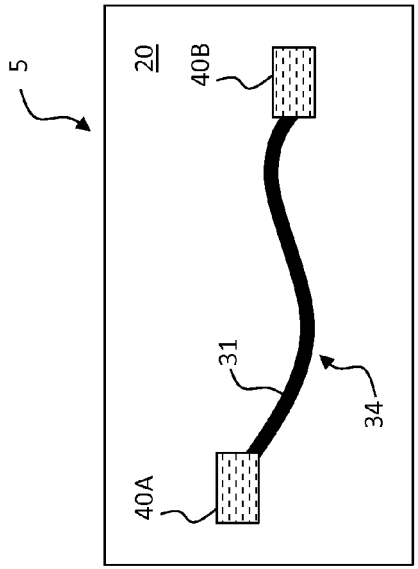
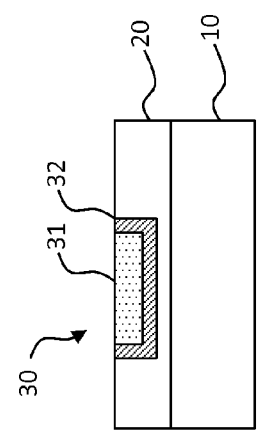
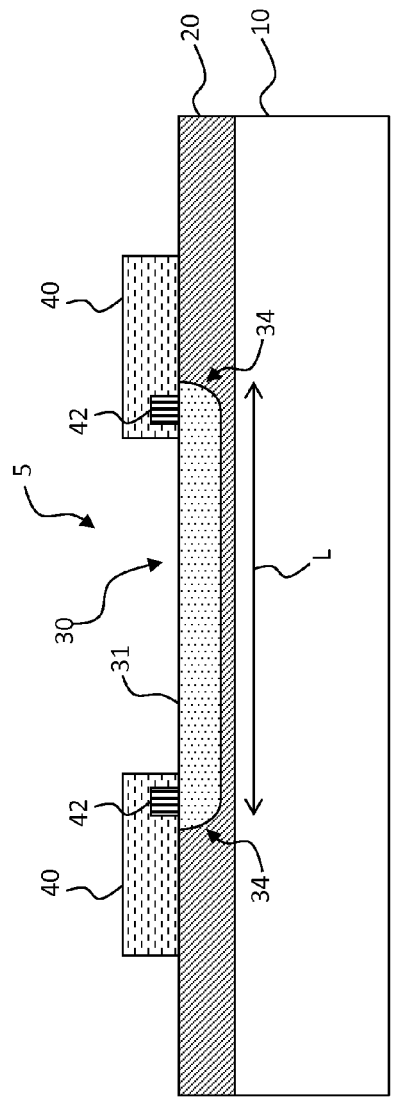

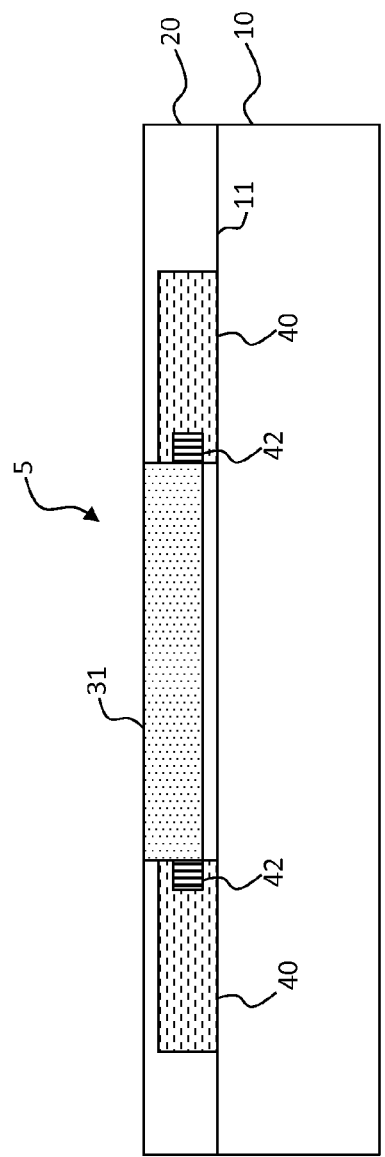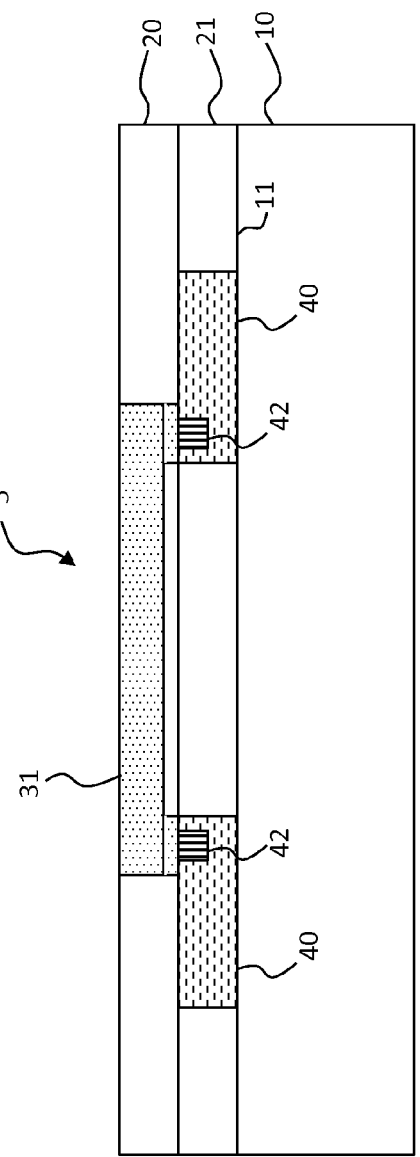

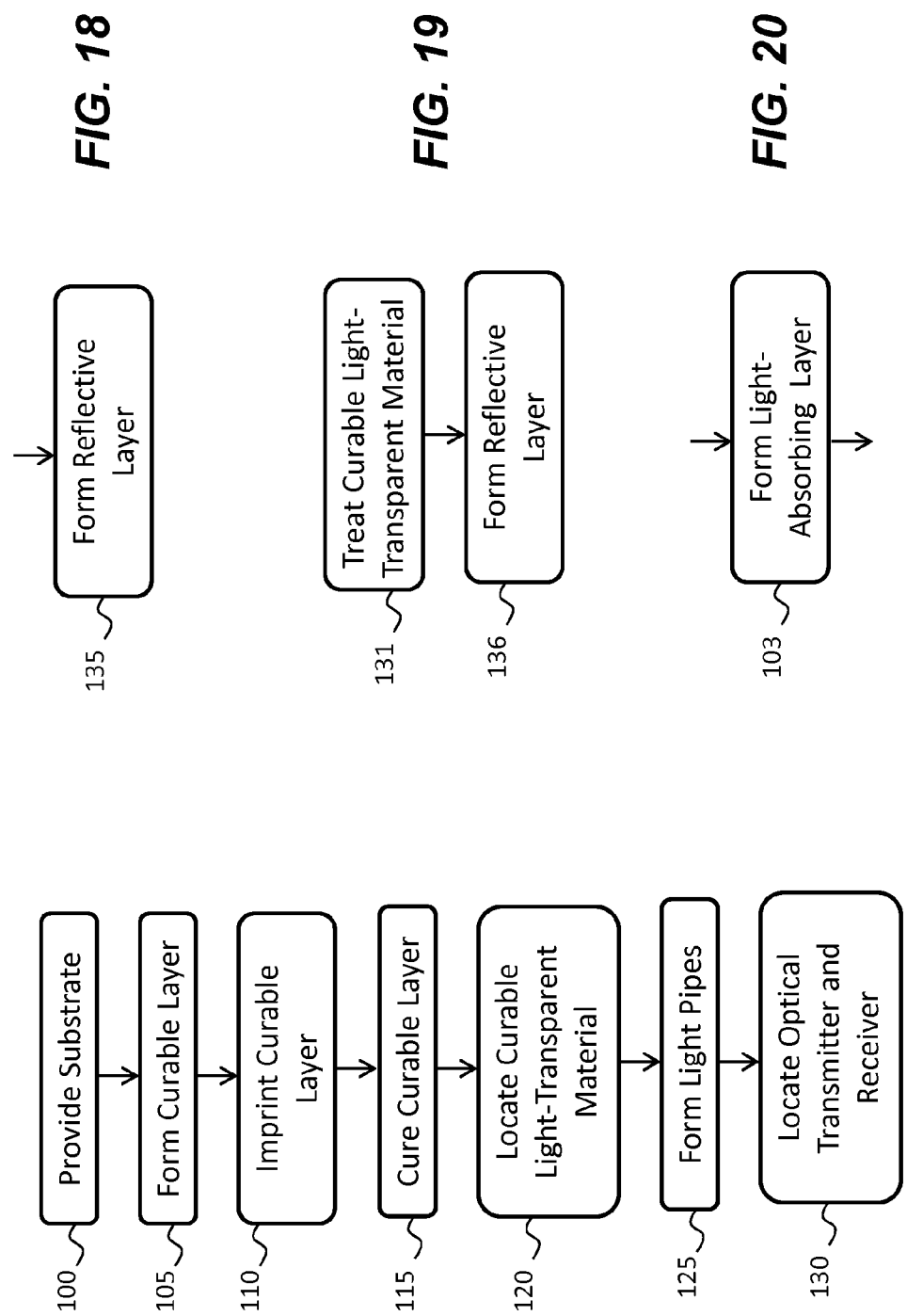

IMPRINTED MULTI-LEVEL OPTICAL CIRCUIT STRUCTURE METHOD

CROSS REFERENCE TO RELATED APPLICATIONS

Reference is made to commonly assigned U.S. patent application Ser. No. 14/012,150, filed Aug. 28, 2013, now U.S. Pat. No. 8,932,474, entitled "Imprinted Multi-level Micro-Structure Method" by Cok et al; U.S. patent application Ser. No. 14/012,216, filed Aug. 28, 2013, entitled "Imprinted Bi-Layer Micro-Structure Method" by Cok; U.S. patent application Ser. No. 13/784,869, filed Mar. 5, 2013, now U.S. Pat. No. 8,895,429, entitled "Micro-Channel Structure with Variable Depths" by Cok; and U.S. patent application Ser. No. 14/097,772 filed Dec. 5, 2013, entitled "Imprinted Multi-level Optical Circuit Structure" by Cok et al the disclosures of which are incorporated herein.

FIELD OF THE INVENTION

The present invention relates to optical circuits imprinted in a layer.

BACKGROUND OF THE INVENTION

Integrated circuits in a computing system typically communicate using electrical signals that pass through small wires embedded within a printed circuit board. Integrated circuits are also known that communicate with optical signals. Such optical signals have advantages in bandwidth and reduced electromagnetic interference. Some optical communication systems are proposed to use free-space, line-of-sight light propagation; others rely on integrated assemblies of light controlling elements.

Prior-art optical interconnection systems are often expensive, for example including elements such as embedded fiber optic cables, connectors, mirrors, holographic elements, and graded index materials or lenses. Such structures are difficult to make and assemble. U.S. Pat. No. 6,755,573 describes a full-mesh optical interconnect used in backplanes that includes power distribution. U.S. Pat. No. 6,320,863 illustrates another backplane structure with optical fiber communication. Micro-lenses associated with a corresponding optical transmission port are also known as disclosed in U.S. Pat. No. 8,437,085.

It is also known to make optical elements using imprinting methods for embossing a resin layer to form a plurality of micro-protrusions for an optical element, for example a brightness-enhancing sheet for a liquid-crystal display backlight module as describe in U.S. Patent Application Publication No. 2008/0079183.

SUMMARY OF THE INVENTION

There is a need for further improvements in methods and structures providing optical interconnections and electrical connectivity that enable simple and flexible manufacturing processes for a variety of applications. Such improved structures and processes according to the present invention are used to make a wide variety of optically interconnected computing circuits at a low cost and with high density.

In accordance with the present invention, a method of making an imprinted optical micro-channel structure for transmitting light to an optical receiver or receiving light from an optical transmitter comprises:

forming a curable optical layer over a substrate and imprinting one or more optical micro-channels in the optical layer with a first stamp;

curing the curable optical layer to form a cured optical layer having the optical micro-channels imprinted in the cured optical layer;

locating a curable light-transparent material in the optical micro-channels and curing the curable light-transparent material to form light-pipes of cured light-transparent material in the optical micro-channels; and locating the optical transmitter in alignment with a light-pipe for transmitting light through the light-pipe or locating the optical receiver in alignment with a light-pipe for receiving light from the light-pipe.

The present invention provides improved structure and methods enable a wide variety of optically interconnected computing circuits at a low cost and with high density. Such improved optical interconnections enable computers or processors to communicate optically.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 3 is a cross-sectional view of a micro-channel taken orthogonally to the cross sections of FIGS. 1 and 2;

FIG. 4 is a plan view of an embodiment of the present invention;

FIG. 5 is a cross-sectional view of yet another embodiment of the present invention;

FIGS. 10-16 are cross-sectional views of alternative embodiments of the present invention; and FIGS. 17-24 are flow diagrams illustrating various methods of the present invention.

The Figures are not drawn to scale since the variation in size of various elements in the Figures is too great to permit depiction to scale.

DETAILED DESCRIPTION OF THE INVENTION

The present invention is directed toward imprinted optical micro-channel structures for transmitting light to an optical receiver or receiving light from an optical transmitter. The light is typically modulated to form an optical signal. In one embodiment, the optical transmitter or optical receiver is formed in an electrically-powered semiconductor device or integrated circuit in a computing or communication system having a plurality of elements. In another embodiment, both the optical transmitter and optical receiver are formed in a single semiconductor device or integrated circuit that can both receive an optical signal from a single optical micro-channel and transmit an optical signal to the single optical micro-channel. Such an optical transmitter and optical receiver is referred to herein as an optical transceiver but, as intended herein, an optical transceiver includes either or both an optical transmitter or optical receiver. The light or optical signal can be visible, infrared, ultraviolet or any other form of electromagnetic radiation that is propagated in an optical micro-channel of the present invention.

Figure 1:
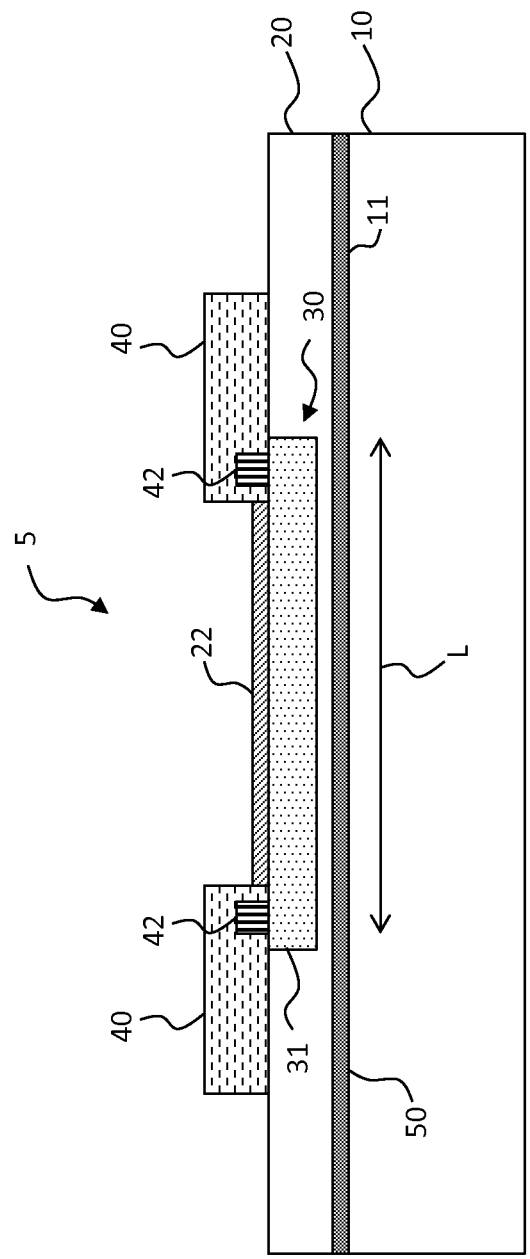
FIG. 1 is a cross-sectional view of an embodiment of the present invention.

Referring to FIG. 1, in one embodiment of the present invention, an imprinted optical micro-channel structure 5 for transmitting light to an optical receiver or receiving light from an optical transmitter includes an optical transceiver 42 that is capable of either or both receiving and transmitting optical signals. In other embodiments (not shown in FIG. 1), an optical receiver and an optical transmitter are separate elements and can operate at the same time, providing a full-duplex communication system, using for example a first optical micro-channel 30 for receiving a first optical signal and a separate second optical micro-channel 30 for simultaneously transmitting a different second optical signal. The optical receiver and the optical transmitter can be part of a single integrated circuit 40 or other semiconductor device or the optical receiver and the optical transmitter are part of separate integrated circuits 40 or other semiconductor devices. By providing optical transceivers 42 in integrated circuits 40, more efficient computation and communication is enabled, since the integrated circuits 40 can include computational and control elements such as analog or digital circuits, thereby reducing the number and size of components and optical micro-channels 30 and simplifying the arrangements of the optical micro-channels 30.

The imprinted optical micro-channel structure 5 includes a substrate 10. A cured optical layer 20 is formed in relation to the substrate 10, for example on a substrate surface 11 of the substrate 10 or a layer formed on the substrate surface 11 of the substrate 10. The cured optical layer 20 includes one or more optical micro-channels 30 imprinted in the cured optical layer 20. Each optical micro-channel 30 includes a cured light-transparent material forming a light-pipe 31 that transmits light in the optical micro-channel 30. A light-transparent material is a material that permits light to travel emitted from an optical transmitter to an optical receiver through a light-pipe made of the light-transparent material. The optical transmitter (optical transceiver 42) is located in alignment with the light-pipe 31 for transmitting light through the light-pipe 31 or the optical receiver (optical transceiver 42) is located in alignment with the light-pipe 31 for receiving light from the light-pipe 31.

The light-pipes 31 illustrated in the Figures are formed in the optical micro-channels 30 and are therefore not readily distinguished in the illustrations. For clarity, the optical micro-channels 30 in which the light-pipes 31 are formed are labeled with corresponding numbered arrows pointing to the optical micro-channels 30. The light-pipes 31 formed in the corresponding optical micro-channels 30 are labeled with numbered lead lines touching the light-pipes 31.

In operation, the integrated circuits 40 control the optical transceivers 42 to send and receive optical signals to and from each other through the light-pipes 31. In the case in which the optical transceivers 42 are formed in the integrated circuits 40, the integrated circuits 40 are thereby communicating to perform, for example, computation or communication tasks.

In one embodiment of the present invention, the cured optical layer 20 has an optical index and the cured light-transparent material in the light-pipe 31 has an optical index greater than the optical index of the cured optical layer 20. Thus, light emitted along a length direction L of the light-pipe 31 can experience total internal reflection and thereby propa-gate effectively along the light-pipe 31 from one optical transceiver 42 to another optical transceiver 42.

In another embodiment of the present invention, the imprinted optical micro-channel structure 5 includes a reflective layer 22 in contact with the cured optical layer 20. The reflective layer 22 reflects light that might escape from the light-pipe 31 back into the light-pipe 31 or towards the optical transceivers 42, thereby increasing the optical signal and reducing cross-talk between adjacent light-pipes 31. In an embodiment, the reflective layer 22 is located on an opposite side of the light-pipe 31 from the substrate 10 (as shown in FIG. 1). In another embodiment, the reflective layer 22 is located between the light-pipe 31 and the substrate 10 (not shown).

In a further embodiment of the present invention, the imprinted optical micro-channel structure 5 includes a light-absorbing layer 50 located between the cured optical layer 20 and the substrate 10 (as shown) or located with the cured optical layer 20 between the light-absorbing layer 50 and the substrate 10 (not shown). The light-absorbing layer 50 can absorb light that escapes from the light-pipe 31 and prevent the escaped light from entering other light-pipes 31 to prevent cross-talk or otherwise improve the signal-to-noise ratio of the optical signals propagated within the light-pipes 31. In an embodiment, the cured optical layer 20 is formed on the light-absorbing layer 50.

Figure 2:
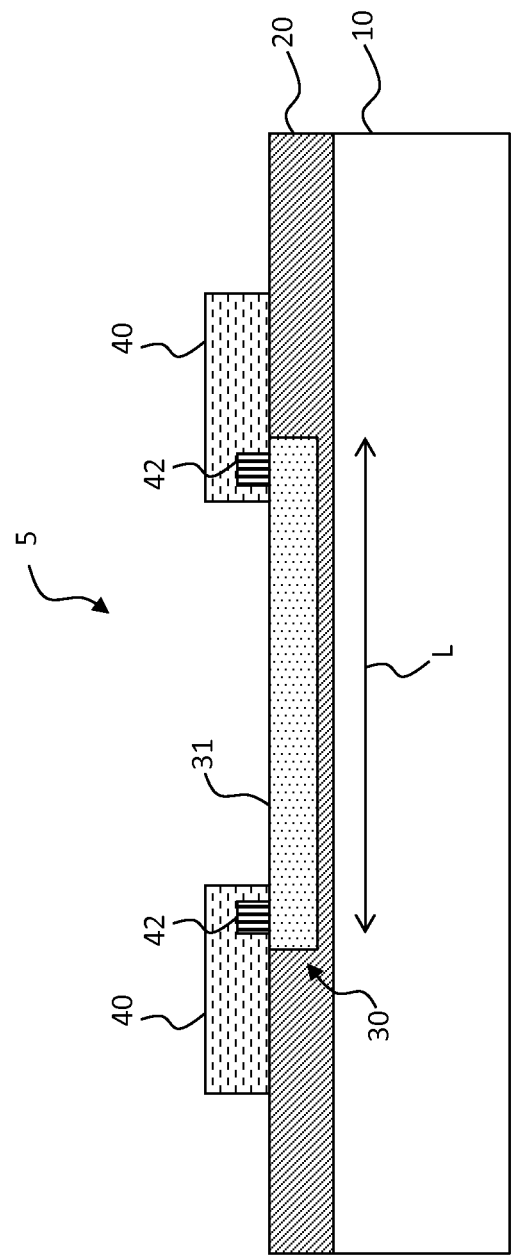
FIG. 2 is a cross-sectional view of another embodiment of the present invention.

Referring to FIG. 2, light emitted from the optical transceiver 42 in the integrated circuit 40 mounted in relation to the substrate 10 in an imprinted optical micro-channel structure 5 can be controlled to stay within a light-pipe 31 by forming the cured optical layer 20 from a light-reflective material so that the cured optical layer 20 is reflective and the optical micro-channels 30 are defined by reflective walls. Alternatively, referring to FIG. 3 in a cross-sectional view of the light-pipe 31 formed in the cured optical layer 20 on the substrate 10 taken orthogonally to the length direction L of the light-pipe 31 (FIG. 2), the light-pipe 31 has a reflective micro-channel wall 32 that reflects light propagating through the light-pipe 31. By providing light-reflective material around a light-pipe 31 or providing reflective micro-channel walls 32, light propagating through the light-pipes 31 is prevented from escaping from the light-pipes 31, thereby increasing the optical signal and reducing cross-talk between adjacent light-pipes 31.

Referring to FIGS. 4-7, in various embodiments the imprinted optical micro-channel structure 5 includes the optical micro-channels 30 imprinted in the cured optical layer 20 on the substrate 10 that are curvilinear or include reflective portions for directing light along the length of the optical micro-channels 30. The light is emitted or received by the optical transceivers 42 in the integrated circuits 40. By providing curvilinear optical micro-channels 30, a greater variety of arrangements of the optical transceivers 42 and the integrated circuits 40 over the substrate 10 is enabled, thereby enabling a greater variety of imprinted optical micro-channel structure 5 designs. By providing reflective portions in the optical micro-channels 30, light propagating through the light-pipes 31 is prevented from escaping from the light-pipes 31, thereby increasing the optical signal and reducing cross-talk between adjacent light-pipes 31.

Figure 6:
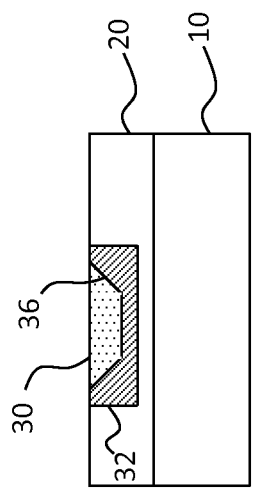
FIG. 6 is a cross-sectional view of a micro-channel taken orthogonally to the cross sections of FIGS. 1, 2, and 5.
Figure 7:
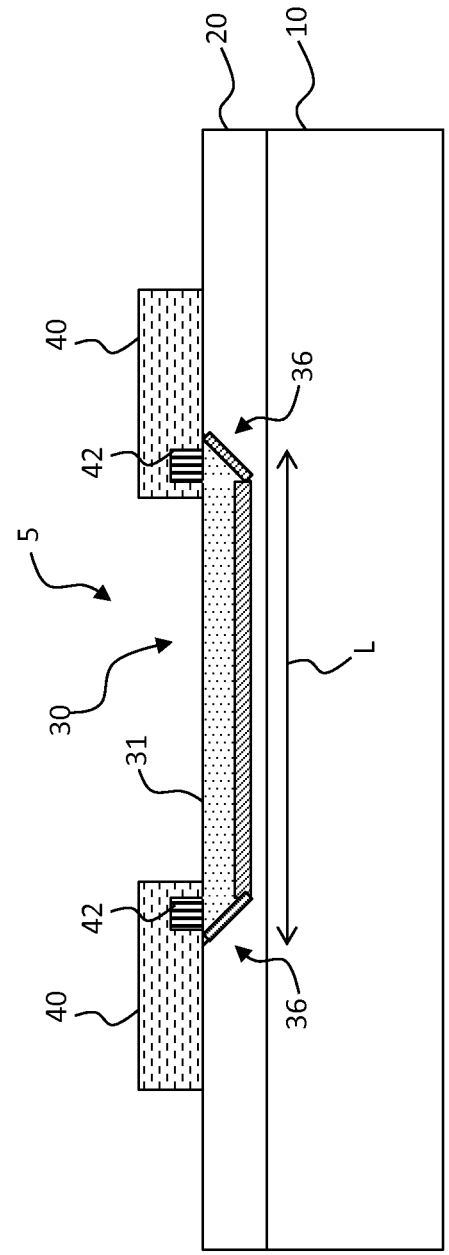
FIGS. 7 and 8 are cross sectional views of other embodiments of the present invention.
Figure 8:
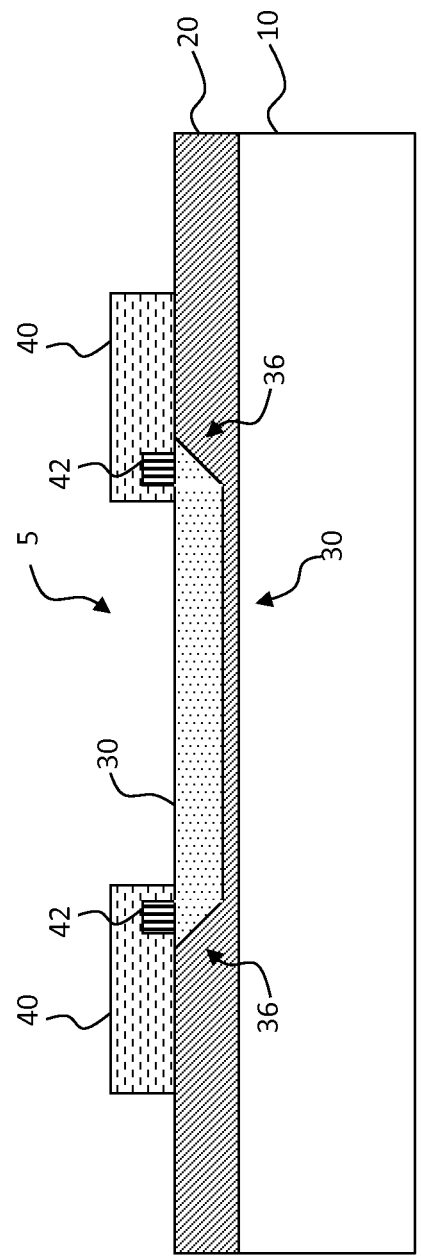

Referring specifically to FIG. 4 in plan view, the light-pipe 31 has curved micro-channel portions 34 and extends from integrated circuit 40A to integrated circuit 40B. As shown in FIG. 5, the light-pipe 31 in cross section includes curved micro-channel portions 34 that reflect light emitted from the optical transceiver 42 along the length direction L of the light-pipe 31 or that reflects light traveling along the length direction L of the light-pipe 31 into the optical transceiver 42. Referring to FIG. 6, in a cross-sectional view of a light-pipe 31 formed in the cured optical layer 20 on substrate 10 taken orthogonally to the length direction L of the light-pipe 31 (FIG. 5) and to FIG. 7 in a cross sectional view taken along the length direction L of light-pipe 31, the light-pipe 31 has reflective angled micro-channel portions 36. In FIGS. 6 and 7, the reflective angled micro-channel portion 36 is a reflective micro-channel wall 32. In FIG. 8, the cured optical layer 20 is reflective (as in FIG. 2) forming the reflective angled micro-channel portion 36. The reflective angled micro-channel portions 36 of FIG. 6 are orthogonal to the reflective angled micro-channel portions 36 of FIGS. 7 and 8 and both can be incorporated into a common light-pipe 31. In any case, light emitted from the optical transceiver 42 in the integrated circuit 40 is reflected along the length direction L of the light-pipe 31 to another optical transceiver 42 in another integrated circuit 40.

Figure 9:
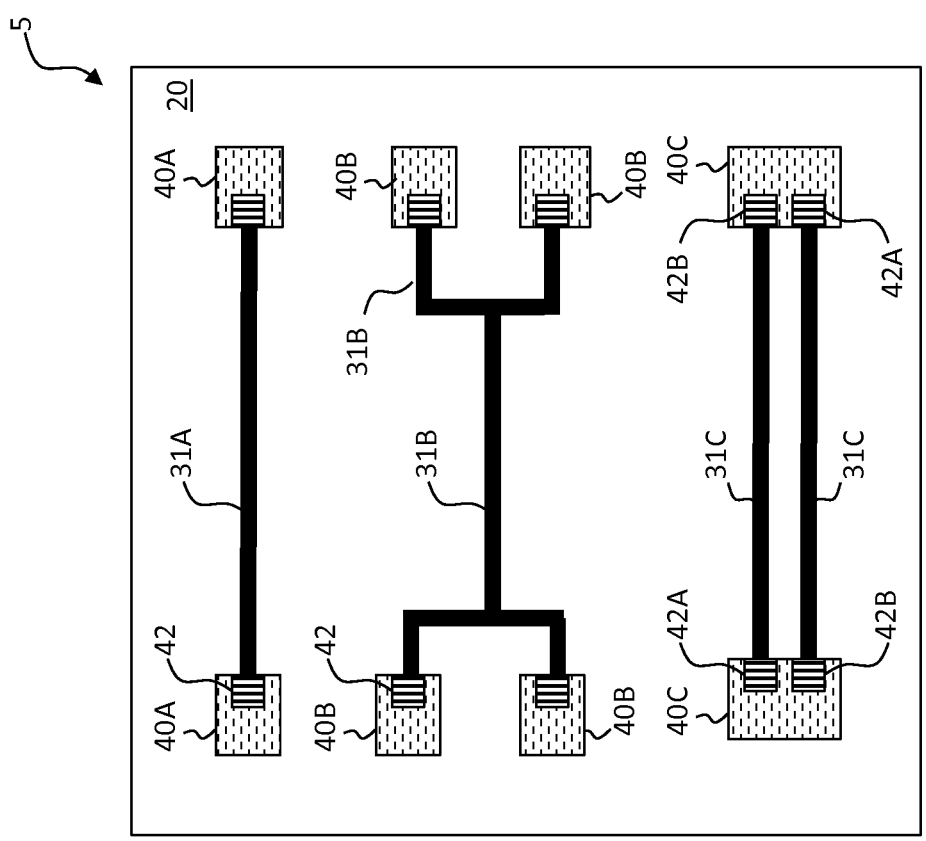
FIG. 9 is a plan view of embodiments of the present invention.

Referring to FIG. 9, in various embodiments of the imprinted optical micro-channel structure 5, one or more integrated circuits 40A, 40B, 40C located on or in the cured optical layer 20 has one or more optical transceivers 42. Each optical transceiver 42 is located in alignment with at least one associated light-pipe 31A, 31B, 31C. The optical transceiver 42 transmits light into the associated light-pipe 31 or receives light from the associated light-pipe 31.

In FIG. 9, the integrated circuits 40A each have one optical transceiver 42 that emits and receives light through the light-pipe 31A. Only two optical transceivers 42 in integrated circuits 40A are aligned with light-pipe 31A. In contrast, the light-pipe 31B is aligned with the optical transceiver 42 in each of the four integrated circuits 40B. In this arrangement, the light-pipe 31B serves as a common optical communication link forming an optical buss for the integrated circuits 40B. Alternatively, the integrated circuits 40C each have one optical transmitter 42A and one optical receiver 42B. Each light-pipe 31C transmits light emitted by the optical transmitter 42A to the optical receiver 42B, forming a full-duplex communication system capable of simultaneously transmitting optical signals and receiving optical signals.

The three arrangements of FIG. 9 can be combined in an optical communication structure in the cured optical layer 20 so that one or more integrated circuits 40 have one or more optical transceivers 42, one or more optical transmitters 42A, or one or more optical receivers 42B. Similarly, the light-pipes 30A, 30B, 30C can be used in a common optical communication structure so that some optical transceivers 42 are connected in a bi-directional point-to-point arrangement (as shown with light-pipe 31A), a shared arrangement (as shown with light-pipe 31B), or a full-duplex arrangement that exclusively transmits optical signals from one optical transmitter 42A to an optical receiver 42B (as shown with light-pipe 31C). Alternatively, the optical transmitter 42A can broadcast optical signals to multiple optical receivers 42B or to multiple optical transceivers 42 through a light-pipe 31 (not shown).

In one embodiment, the optical transceivers 42 are located in the integrated circuits 40 on the cured optical layer 20, as shown in FIG. 1. In another embodiment, the optical transceivers 42 are located in the integrated circuits 40 and at least partly in the cured optical layer 20. Referring to FIG. 10, the integrated circuits 40 having the optical transceivers 42 are located in the cured optical layer 20 on the substrate surface 11 of the substrate 10. The optical transceivers 42 are optically connected by light-pipe 31 to form an imprinted optical micro-channel structure 5 of the present invention. Alternatively, referring to FIG. 11, the integrated circuits 40 having the optical transceivers 42 are located in the layer 21 formed between the cured optical layer 20 and the substrate surface 11 of the substrate 10. In an embodiment, the layer 21 is a cured layer similar to the cured optical layer 20 formed in a separate step. The optical transceivers 42 are optically connected by the light-pipe 31 to form an imprinted optical micro-channel structure 5 of the present invention. In this embodiment, the light-pipe 31 can be a multi-layer light-pipe 31 to facilitate the propagation of light through the light-pipe 31.

Figure 12:
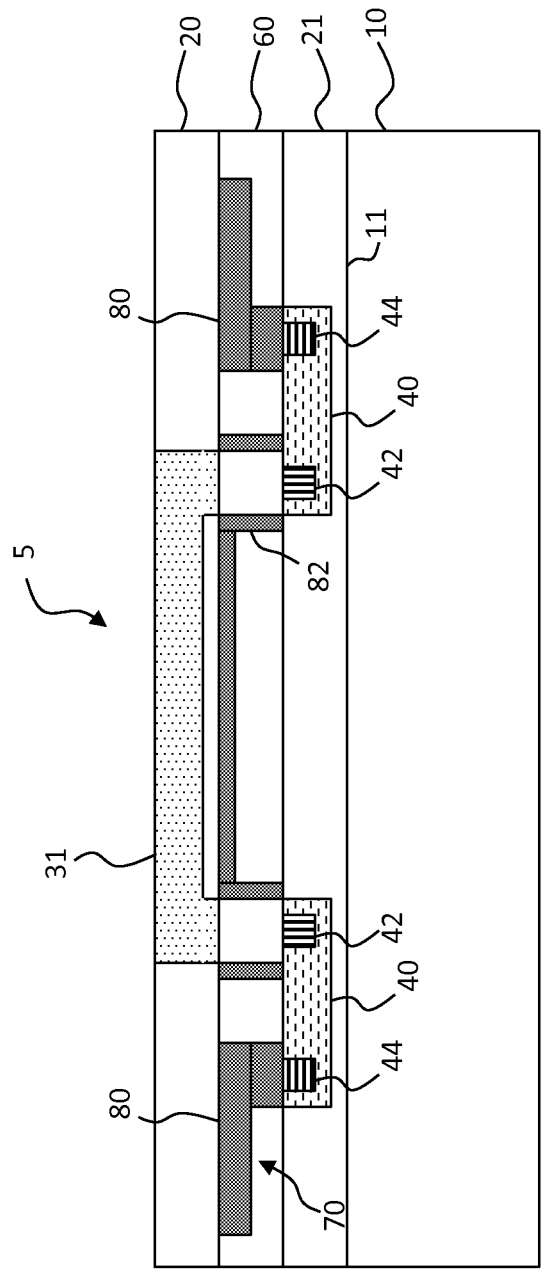
Figure 13:
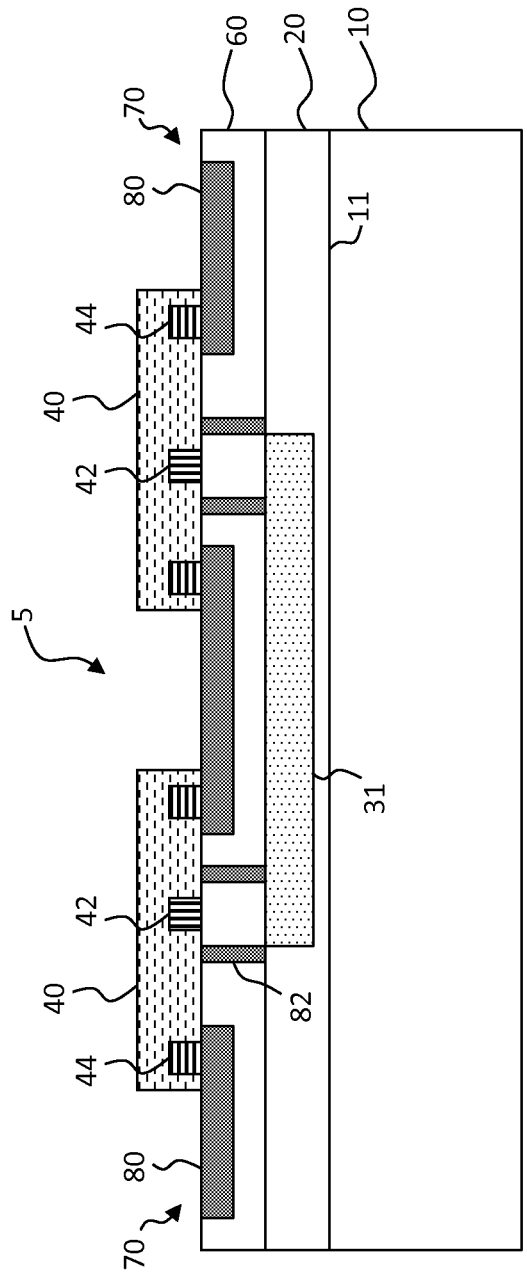

Referring to FIGS. 12 and 13, in a further embodiment of the present invention, the imprinted optical micro-channel structure 5 includes a cured electrical layer 60 in contact with the cured optical layer 20 and formed on the layer 21 on the substrate surface 11 of the substrate 10 (FIG. 12) or formed on the cured optical layer 20. The integrated circuits 40 having the optical transceivers 42 are located adjacent to the cured electrical layer 60 in the layer 21 (FIG. 12) or on the cured electrical layer 60 opposite the cured optical layer 20 (FIG. 13). The cured electrical layer 60 includes electrical micro-channels 70 imprinted in the cured electrical layer 60. The electrical micro-channels 70 include a cured electrically conductive material forming micro-wires 80 in the electrical micro-channels 70. The integrated circuit 40 further includes one or more electrical contacts 44. Each electrical contact 44 is electrically connected to at least one micro-wire 80.

Micro-wires 80 illustrated in the Figures are formed in electrical micro-channels 70 and are therefore not readily distinguished in the illustrations. For clarity, the electrical micro-channels 70 in which the micro-wires 80 are formed are labeled with corresponding numbered arrows pointing to the electrical micro-channels 70. The micro-wires 80 formed in the corresponding electrical micro-channels 70 are labeled with numbered lead lines touching the micro-wires 80.

By providing the cured electrical layer 60 with electrical micro-channels 70, and micro-wires 80, electrical power and signals are provided to the integrated circuits 40 and optical transceivers 42 in a solid-state structure.

As shown in the embodiment of FIG. 12, the cured electrical layer 60 is located between the cured optical layer 20 and the substrate 10. Alternatively, as shown in FIG. 13, the cured optical layer 20 is located between the cured electrical layer 60 and the substrate 10.

In the embodiment of FIG. 12, the light-pipe 31 is a multi-layer light-pipe 31 optically connecting the optical transceivers 42. In a further embodiment, at least one micro-wire 80 is a reflective micro-wire 82 and is located to reflect light transmitted by the optical transceiver 42, for example through the cured electrical layer 60 from the optical transceiver 42 to the light-pipe 31. Alternatively or in addition, the reflective micro-wire 82 is located along the length direction L (FIG. 1) of an optical micro-channel 30, thereby facilitating the propagation of light through the light-pipe 31 to increase the optical signal and reduce cross-talk between the light-pipes 31. Both of these structures are shown in both FIGS. 12 and 13. FIGS. 12 and 13 show similar structures but are alternative embodiments that are reversed with respect to the substrate 10.

Figure 14:
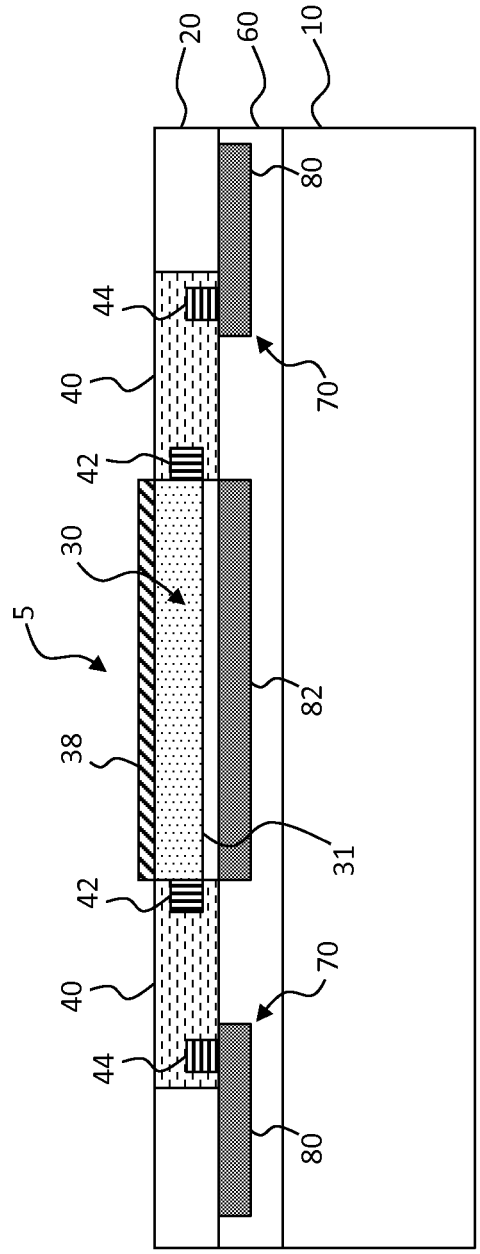

Referring to FIG. 14, in yet another embodiment, the optical micro-channel 30 includes an optical structure 38 that processes light propagating along light-pipe 31, thereby modifying optical signals propagating in the light-pipe 31, for example to improve the optical signal by filtering or redirecting the optical signal. The optical structure 38 is formed either in the light-pipe 31 or adjacent to the light-pipe 31, for example in optical contact with the cured optical layer 20 or with the cured electrical layer 60. In this embodiment, the cured electrical layer 60 is located between the cured optical layer 20 and the substrate 10. The cured electrical layer 60 includes the micro-wires 80 formed in the electrical micro-channels 70 electrically connected to electrical contacts 44 of integrated circuits 40 and reflective micro-wire 82. Optical transceivers 42 in integrated circuits 40 emit light into light-pipe 31 or receive light from light-pipe 31.

Figure 15:
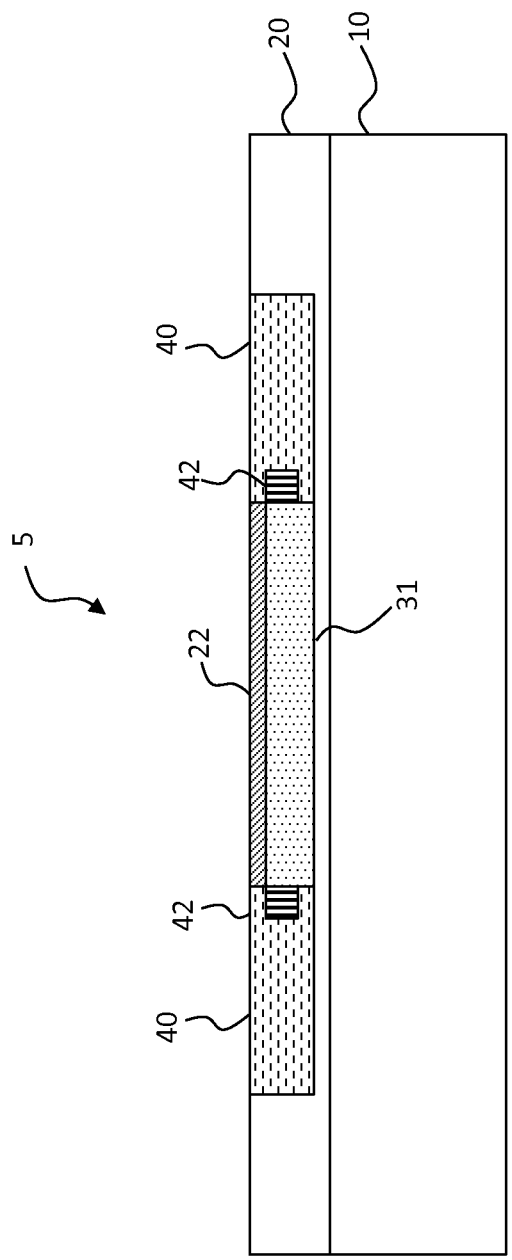

Referring to FIG. 15, in another embodiment, the optical micro-channel 30 is partially filled with light-transparent material and partially filled with the reflective layer 22. The reflective layer 22 reflects light along the light-pipe 31 to improve the optical signal and prevent cross-talk between light-pipes 31. Optical transceivers 42 in integrated circuits 40 emit light into the light-pipe 31 or receive light from the light-pipe 31. The integrated circuits 40 are located in the cured optical layer 20. In FIG. 15, the reflective layer 22 is located on the light-pipe 31 opposite the substrate 10. In an alternative arrangement (not shown), the reflective layer is located between the light-pipe 31 and the substrate 10.

Figure 16:
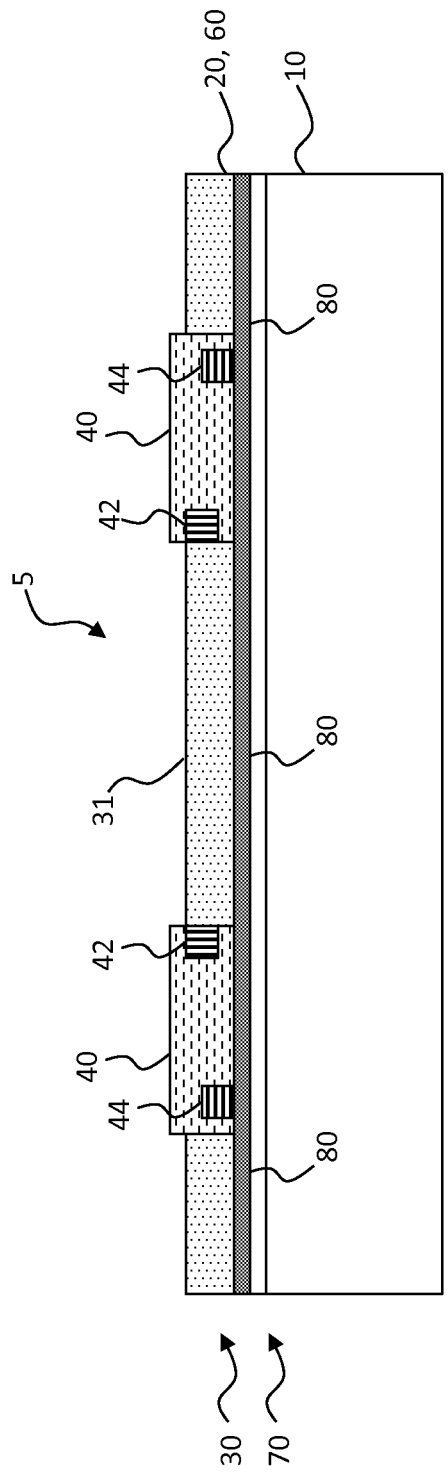

Referring to FIG. 16, in another embodiment, the cured electrical layer 60 and the cured optical layer 20 are a common layer. The micro-wires 80 are located between the light-pipes 31 and the substrate 10. Alternatively, the light-pipes 31 are located between the micro-wires 80 and the substrate 10 (not shown). In these embodiments, the optical and electrical micro-channels 30, 70 are common micro-channels (although they can be multi-layer micro-channels) with two sub-layers, one sub-layer including the micro-wires 80 and the other sub-layer including the light-pipes 31. The micro-wires 80 can reflect light propagating through the light-pipes 31 from the optical transceivers 42 of the integrated circuits 40 and are also electrically connected to the electrical contacts 44 of the integrated circuits 40. The micro-wires 80 thus provide both electrical power and signals and reflect stray light as a reflective micro-wire 82 (not indicated). The sub-layer furthest from the substrate 10 is a spatial superset of the sub-layer closer to the substrate 10. In this embodiment, every micro-channel is both an optical and electrical micro-channel 30, 70. However, not all of the electrical micro-wires 80 need be electrically connected to an electrical contact 40. Nor does every light-pipe need to be connected to an optical transceiver 42. The structure of FIG. 16 usefully reduces the number of imprinting steps needed to make the optical and electrical micro-channels 30, 70.

In one embodiment of the present invention, the optical transmitter or receiver (optical transceiver 42) is an edge optical transmitter or receiver (as shown in FIGS. 10 and 14-16). In another embodiment, the optical transmitter or receiver (optical transceiver 42) is a surface optical transmitter or receiver (as shown in FIGS. 1 and 2). The optical transmitter can be a light-emitting diode or laser diode. The optical receiver can be a light-sensitive semiconductor junction, for example as found in silicon diodes. Such edge or surface optical transmitters are known in the art, as are light-sensitive semiconductor elements, for example diodes or transistors found in integrated circuits.

Referring to FIG. 17, a method of making an imprinted optical micro-channel structure 5 for transmitting light to an optical receiver or receiving light from an optical transmitter according to an embodiment of the present invention includes providing a substrate 10 in Step 100 and forming a curable optical layer 20 over the substrate 10 in Step 105. One or more optical micro-channels 30 are imprinted in the curable optical layer 20 with a first stamp in Step 110. The curable optical layer 20 is cured in Step 115 to form a cured optical layer 20 having the optical micro-channels 30 imprinted in the cured optical layer 20. The provision of substrates 10 is known in the art as are ways to coat curable materials on the substrate 10 and imprinting the curable materials, for example using imprinting stamps.

A curable light-transparent material is located in Step 120 in the optical micro-channels 30 and cured to form light-pipes 31 of cured light-transparent material in the optical micro-channels 30 (Step 125). Curable light-transparent materials are known having a variety of optical indices (for example resins or epoxies of various types with optical indices of between 1.3 and 1.8 having fluorine or sulfur compounds) and can be coated using conventional methods, e.g. curtain, hopper, blade, or spin coating. An optical transmitter or receiver, or an optical transceiver 42 including either or both an optical transmitter or receiver, is located on the cured optical layer 20 in Step 130 in alignment with the light-pipe 31 for transmitting light through the light-pipe 31 or locating the optical receiver in alignment with a light-pipe 31 for receiving light from the light-pipe 31. In an embodiment, the optical transceiver 42 is part of an integrated circuit 40 and is adhered to the imprinted optical micro-channel structure by the materials making up the cured optical layer 20. An optical transmitter or receiver, or an optical transceiver 42, is made using known photolithographic methods in integrated circuit manufacturing.

In a further embodiment as illustrated in FIG. 18, the reflective layer 22 is formed in contact with the cured optical layer 20 in Step 135 after the curable light-transparent material is cured. The reflective layer 22 can extend generally over the integrated circuit 40 and portions of the cured optical layer 20 (not shown). In an embodiment the integrated circuit 40 and portions of the cured optical layer 20 are masked to prevent deposition of light-reflective material in unwanted areas. The deposition of light-reflective materials (for example metals) is known in the art, for example by sputtering, evaporation, or atomic layer deposition, as are photo-lithographic patterning methods. In another embodiment, the reflective layer 22 is formed on the walls of the optical micro-channel 30, for example by sputtering, evaporation, or atomic layer deposition processes. To prevent unwanted deposition, portions of the cured optical layer 20 can be masked using conventional photolithographic techniques. In an alternative embodiment, the reflective layer 22 is formed between the cured optical micro-channel 30 and the substrate 10 by conventional deposition methods.

In an alternative or additional embodiment illustrated in FIG. 20, the light-absorbing layer 50 is formed in Step 103 between the cured optical layer 20 and the substrate 10, for example using coating processes and materials known in the art, for example spin or hopper coating with resins impregnated with light-absorbing particles, such as carbon black.

A wide variety of arrangements of reflective layers 22 or light-absorbing layers 50 are contemplated as part of the present invention. The reflective layers 22 and light-absorbing layers 50 are located to control the propagation of light from one optical transceiver 42 to another optical transceiver 42. The reflective layer 22 directs light along the light-pipes 31 to increase the optical signal and prevent light from escaping from the light-pipes. The light-absorbing layer 50 absorbs stray light and reduces noise in the optical system.

In another embodiment, reflective portions of the optical micro-channels 30 are formed by using a shaped stamp. The shapes impressed in the optical micro-channels 30 can direct light along the length of the optical micro-channels 30. For example, angled or curved micro-channels portions 34, 36 improve light reflection around a corner or curve and are impressed with an imprinting stamp. Methods for forming impressing stamps are known in the art.

Figure 21:
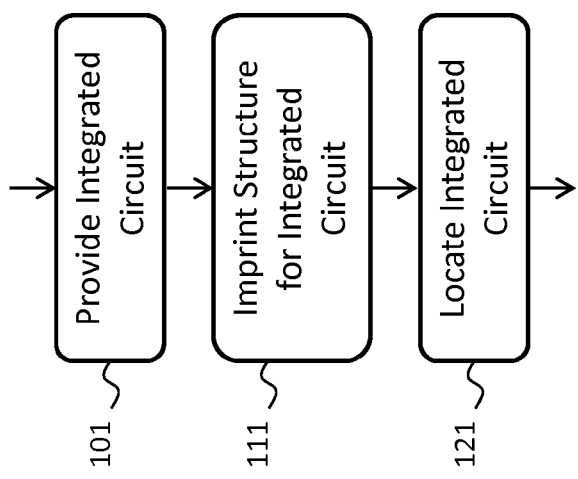

In a further embodiment of the present invention and as illustrated in FIG. 21, one or more integrated circuits 40 having one or more optical transceivers 42 is located with the optical transceivers 42 in alignment with a corresponding one or more light-pipes 31. An integrated circuit 40 is provided in Step 101 and located in Step 121. The integrated circuit 40, in various embodiments, is located on the substrate surface 11 of the substrate 10, between the cured optical layer 20 and the substrate 10, in the cured optical layer 20, or on the cured optical layer 20 opposite the substrate 10. In embodiments, the integrated circuit 40 is located by stamping or by pick-and-place methods known in the manufacturing arts. In one embodiment, the curable optical layer 20 or curable electrical layer 60 in Step 111 is imprinted to form an impression in which the integrated circuit 40 is located. Such an impression can help align the optical transceiver 42 with a light-pipe 31 and can be performed in a common step with imprinting the optical micro-channels 30 or electrical micro-channels 70.

In another embodiment illustrated in FIG. 19, the curable light-transparent material in the optical micro-channel 30 is treated in Step 131 to reduce the size of the light-transparent material for example, by curing and shrinking with heat or radiation, or removing solvents from the curable light-transparent materials by drying. The light-transparent material then only fills a portion of the optical micro-channel 30. In Step 136, a reflective material is located in the optical micro-channel 30 with the cured light-transparent material to form a reflector for controlling light propagating in the optical micro-channel 30. Alternatively, the light-transparent material located in the optical micro-channel 30 does not fill the optical micro-channel 30 when coated over the cured optical layer 20 and the reflective material is located in the optical micro-channel 30 before the light-transparent material is cured. In another embodiment, the reflective material is deposited in the optical micro-channel 30 before the light-transparent material. In various embodiments, reflective material is deposited with or without masking by sputtering or evaporation, or liquid materials with reflective components (such as is the case with conductive inks) are coated and cured.

Figure 22:
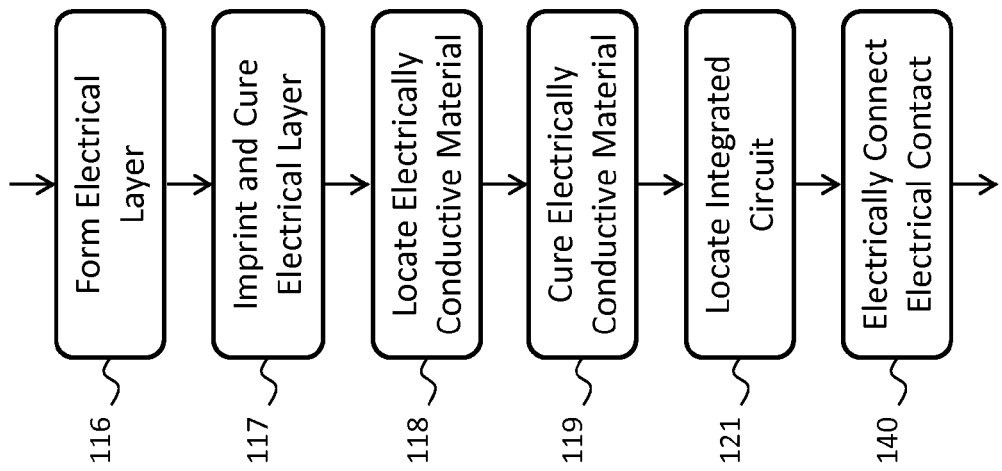

In a further embodiment of the present invention, referring to FIG. 22, the curable electrical layer 60 is formed in contact with the cured optical layer 20 in Step 116. The electrical micro-channels 70 are imprinted in the curable electrical layer 60 and cured in Step 117. In an embodiment, the provision and curing of the curable electrical layer 60 and the imprinting of the electrical micro-channels is done using the same materials and processes as are used for the curable optical layer 20.

A curable electrically conductive material is located in the electrical micro-channels for example by coating and wiping, in Step 118 and cured in Step 119 to form a micro-wire 80 each of the electrical micro-channels 70. Coating and wiping methods for conductive inks are known, as are inkjet deposition methods for example as disclosed in U.S. patent application Ser. No. 14/012,195, filed Aug. 28, 2013, entitled "Imprinted Multi-level Micro-Structure" by Cok et al; U.S. patent application Ser. No. 14/012,269, filed Aug. 28, 2013, entitled "Imprinted Bi-Layer Micro-Structure" by Cok; and U.S. patent application Ser. No. 13/784,869, filed Mar. 5, 2013, entitled "Micro-Channel Structure with Variable Depths" by Cok; the disclosures of which are incorporated herein.

Integrated circuits 40 with electrical contacts 44 are located in alignment with the micro-wires 80 in Step 121 and electrically connected in Step 140. In one embodiment, the electrical contacts 44 are coated with electrically conductive connecting materials, such as solder or anisotropic conductive film and treated, for example by heat, pressure, or radiation to form the electrical connections between at least one micro-wire 80 and one electrical contact 44. Such electrical-connection materials and electrical-connection processes are known in the art.

Figure 23:
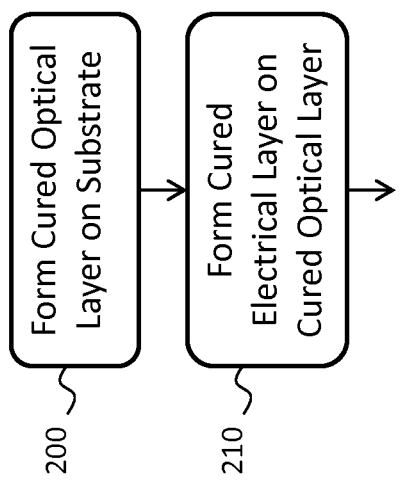
Figure 24:
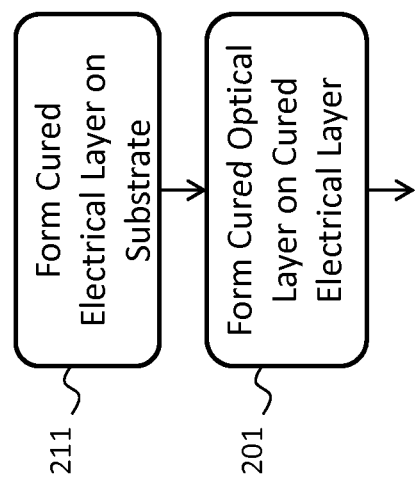

In various embodiments illustrated in FIGS. 23 and 24, the cured electrical layer 60 is located between the cured optical layer 20 and the substrate 10 or the cured optical layer 20 is located between the cured electrical layer 60 and the substrate 10. The various layers are located in various relative positions by forming, impressing, curing, and filling the micro-channels in each layer in different orders. As illustrated in FIG. 23, the cured optical layer 20 is formed in Step 200 on the substrate 10 and the cured electrical layer 60 is subsequently formed on the cured optical layer 20 in Step 210. Alternatively, as illustrated in FIG. 24, the cured electrical layer 60 is formed in Step 211 on the substrate 10 and the cured optical layer 20 is subsequently formed on the cured electrical layer 60 in Step 201. Similarly, the location of the integrated circuits 40 in the layers is controlled by the order in which the integrated circuits are placed in the layers relative to the formation of the layers and corresponding micro-channels.

In other embodiments, at least one micro-wire is located to reflect light transmitted by an optical transceiver. The at least one reflective micro-wire 82 is located along the length of an optical micro-channel 30 or is located to reflect light from the optical transceiver 42 to the optical micro-channel 30. The location of reflective elements is controlled, for example by shaping the imprinting stamp to form corresponding structures in either the cured optical layer 20 or the cured electrical layer 60 or by depositing material over one or more of the cured electrical or cured optical layers 60, 20, either with a pattern-wise deposition or a blanket deposition with or without subsequent patterning for example with masking or etching.

According to various embodiments of the present invention, the substrate 10 is any material having a substrate surface 11 on which the cured optical layer 20 is formed. The substrate 10 is a rigid or a flexible substrate made of, for example, a glass, metal, plastic, or polymer material, with or without additional layers formed thereon, and can have opposing substantially parallel and extensive surfaces. The substrates 10 can include a dielectric material and can have a wide variety of thicknesses, for example 10 microns, 50 microns, 100 microns, 1 mm, or more. In various embodiments, the substrate 10 is transparent, for example transmitting 50%, 80%, 90%, 95% or more of light emitted by the optical transmitter. Materials and manufacturing processes for making suitable substrates 10 and substrate surfaces 11 on which layers are coated are known in the art. The substrate 10 can be an element of other devices, for example the cover or substrate of a display or a substrate, cover, or dielectric layer of a touch screen.

The cured optical layer 20 is a layer of curable material that has been cured and, for example, formed of a curable material coated or otherwise deposited on a surface, for example the substrate surface 11 of the substrate 10, to form a curable layer. The substrate-coated curable material is considered herein to be curable layer before it is cured and a cured layer after it is cured.

In various embodiments, curable layers are deposited as a single layer in a single step using coating methods known in the art, e.g. curtain coating, hopper coating, or blade coating. In an alternative embodiment, curable layers are deposited as multiple sub-layers using multi-level deposition methods known in the art, e.g. multi-level slot coating, repeated curtain coatings, or multi-level extrusion coating. In yet another embodiment, curable layers include multiple sub-layers formed in different, separate steps, for example with a multi-level extrusion, curtain coating, or slot coating as is known in the coating arts.

Cured layers (e.g. the cured optical layer 20) useful in the present invention can include a cured polymer material, such as resin, with cross-linking agents that are sensitive to heat or radiation, for example infra-red, visible light, or ultra-violet radiation. SU-8 is such a useful material. The polymer material can be a curable material applied in a liquid form that hardens when the cross-linking agents are activated, for example with exposure to radiation or heat.

When a molding device, such as an imprinting stamp having an inverse micro-channel structure is applied to liquid curable material in a curable layer coated on the substrate 10 and the cross-linking agents in the curable material are activated, the liquid curable material in the curable layer is hardened into the cured optical layer 20 having optical micro-channels 30 or the cured electrical layer 60 having electrical micro-channels 70 with the inverse structure of the stamp. The liquid curable materials can include a surfactant to assist in controlling coating. Materials, tools, and methods are known for imprinting coated liquid curable materials to form cured layers having optical or electrical micro-channels 30, 70.

In some embodiments, an optical or electrical micro-channel 30, 70 is a groove, trench, or channel formed in the cured optical layer 20 or cured electrical layer 60 and having a cross-sectional width less than 20 microns, for example 10 microns, 5 microns, 4 microns, 3 microns, 2 microns, 1 micron, or 0.5 microns, or less. In an embodiment, a micro-channel depth is comparable to a micro-channel width. Optical or electrical micro-channels 30, 70 can have a rectangular cross section, as shown in the Figures. Other cross-sectional shapes, for example trapezoids, are known and are included in the present invention. The width or depth of a layer is measured in cross section.

In an embodiment, optical or electrical micro-channels 30, 70 are imprinted and cured in curable layers in a single step and micro-wires 80 are formed by depositing a curable conductive ink in electrical micro-channels 70 and curing the curable conductive ink to form an electrically conductive micro-wire 80. Micro-wires 80 are formed in electrical micro-channels 70 by locating, e.g. by coating, liquid conductive materials, for example curable conductive inks, into the electrical micro-channels 70 and curing the liquid conductive materials to form micro-wires 80. The micro-wires 80 can be less than 20 microns wide, less than 10 microns wide, less than 5 microns wide, less than 2 microns wide, or less than one micron wide. According to an embodiment of the present invention, the substrate 10, the cured optical layer 20, and the cured electrical layer 60 are substantially transparent (for example more than 50%, 70%, 80%, 90%, or 95% transparent to visible light) and the micro-wires 80 are imperceptible to the unaided human visual system. Furthermore, in an embodiment the micro-wires 80 are substantially uniformly distributed over the substrate 10 so that the light absorbed or reflected by the micro-wires 80 is uniform over the substrate 10 and the imprinted multi-channel structure 5 of the present invention has a uniform appearance.

Curable conductive inks useful in the present invention are known and can include conductive inks having electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in electrical micro-channels 70 and cured, for example by heating or exposure to radiation such as infra-red, visible light, or ultra-violet radiation. The curable ink hardens to form the cured ink that makes up micro-wires 80. For example, a curable conductive ink with conductive nano-particles is located within electrical micro-channels 70 and heated to agglomerate or sinter the nano-particles, thereby forming an electrically conductive micro-wire 80. Materials, tools, and methods are known for coating liquid curable inks to form micro-wires 80 in electrical micro-channels 70. The curable conductive ink is not necessarily electrically conductive before it is cured.

It has been experimentally demonstrated that electrical micro-channels 70 having a width of about 1.8 microns formed in the cured electrical layer 60 with a depth of about four microns are filled with liquid curable conductive inks containing silver nano-particles and cured with heat to form micro-wires 80 that conduct-electricity.

A variety of micro-wire 80 or electrical micro-channel 70 patterns can be used and the present invention is not limited to any one pattern. Micro-wires 80 can be spaced apart, form separate electrical conductors, or intersect to form a mesh electrical conductor on or in a layer. Electrical micro-channels 70 can be identical or have different sizes, aspect ratios, or shapes. Similarly, micro-wires 80 can be identical or have different sizes, aspect ratios, or shapes. Micro-wires 80 can be straight or curved.

In various embodiments, cured inks can include metal particles, for example nano-particles. The metal particles are sintered to form a metallic electrical conductor. The metal nano-particles are silver or a silver alloy or other metals, such as tin, tantalum, titanium, gold, copper, or aluminum, or alloys thereof. Cured inks can include light-absorbing materials such as carbon black, a dye, or a pigment.

Micro-wires 80 can include metal, for example silver, gold, aluminum, nickel, tungsten, titanium, tin, or copper or various metal alloys including, for example silver, gold, aluminum, nickel, tungsten, titanium, tin, or copper. Micro-wires 80 can include a thin metal layer composed of highly conductive metals such as gold, silver, copper, or aluminum. Other conductive metals or materials can be used. Alternatively, micro-wires 80 can include cured or sintered metal particles such as nickel, tungsten, silver, gold, titanium, or tin or alloys such as nickel, tungsten, silver, gold, titanium, or tin. Conductive inks are used to form micro-wires 80 with pattern-wise deposition or pattern-wise formation followed by curing steps. Other materials or methods for forming micro-wires, such as curable ink powders including metallic nano-particles, can be employed and are included in the present invention.

In an embodiment, a curable ink can include conductive nano-particles in a liquid carrier (for example an aqueous solution including surfactants that reduce flocculation of metal particles, humectants, thickeners, adhesives or other active chemicals). The liquid carrier is located in micro-channels and heated or dried to remove liquid carrier or treated with hydrochloric acid, leaving a porous assemblage of conductive particles that are agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

In various embodiments of the present invention, micro-channels or micro-wires have a width less than or equal to 10 microns, 5 microns, 4 microns, 3 microns, 2 microns, or 1 micron. In an example and non-limiting embodiment of the present invention, each micro-wire is from 10 to 15 microns wide, from 5 to 10 microns wide, from one micron to five microns wide or from one/half micron to one micron wide. In some embodiments, micro-wires 80 can fill electrical micro-channels 70; in other embodiments micro-wires 80 do not fill electrical micro-channels 70. In an embodiment, micro-wires 80 are solid; in another embodiment micro-wires 80 are porous.

Electrically conductive micro-wires 80 of the present invention are electrically connected through electrical contacts 44 to integrated circuits 40 and electrical connectors to electrical circuits that provide electrical current to micro-wires 80 and can control the electrical behavior of micro-wires 80 and integrated circuits 40.

In embodiments of the present invention, the integrated circuit 40 is formed on an integrated circuit substrate distinct and separate from the substrate 10, for example a semiconductor substrate such as silicon formed in a semiconductor fabrication facility separately from the substrate 10 that is, for example, glass or plastic. The integrated circuit 40 can include digital or analog electrical circuits electrically connected to one or more of the electrical contacts 44 and to the optical transceiver 42. For example, the integrated circuit 40 is a digital logic circuit. The integrated circuits 40 of embodiments of the present invention can be placed in a variety of locations and with different orientations. In an embodiment, the integrated circuits 40 are small (e.g. with a dimension less than or equal to 10, 20, 30, or 50 microns).

Integrated circuits 40 can have a crystalline substrate to provide higher performance active components than are found in, for example, thin-film amorphous or polycrystalline silicon devices. Integrated circuits 40 can have a thickness of 100 um or less, preferably 50 um or less, and in some embodiments 20 um or less or 10 um or less. This facilitates formation of the adhesive and planarization material over the integrated circuits 40 that can then be applied using conventional spin-coating techniques. According to one embodiment of the present invention, the integrated circuits 40 formed on crystalline silicon substrates are arranged in a geometric array and adhered to a device substrate (e.g. 10) with adhesion or planarization materials. Electrical contacts 44 on the surface of the integrated circuits 70 are employed to connect each the integrated circuits 40 to signal wires, power busses, or micro-wires 80.

In an embodiment, the integrated circuits 40 are formed in a semiconductor substrate and the circuitry of the integrated circuits 40 is formed using modern lithography tools. With such tools, feature sizes of 0.5 microns or less are readily available. For example, modern semiconductor fabrication lines can achieve line widths of 90 nm or 45 nm and can be employed in making the integrated circuits 40 of the present invention. The integrated circuits 40, however, also requires electrical contacts 44 for making electrical connection to the micro-wires 80 once the integrated circuits 40 are assembled onto the substrate 10 or layers formed on the substrate 10. The electrical contacts 44 can be sized based on the feature size of the lithography tools used on the substrate 10 (for example 5 um) and the alignment of the integrated circuits 10 to the micro-wires 80 (for example +/−5 um). Therefore, the electrical contacts 44 can be, for example, 15 um wide with 5 um spaces between the electrical contacts 44. This means that the electrical contacts 44 will generally be significantly larger than the transistor circuitry formed in the integrated circuits 40.

In an embodiment, the optical transceivers 42 are formed in an integrated circuit 40. In another embodiment, the optical transceivers 42 are formed on a semiconductor substrate without additional electronic elements. The optical transceivers 42 can be light-emitting diodes, either integrated or individual. The optical transceivers 42 can be edge-emitting or surface-emitting. Methods and devices for forming and providing integrated circuits 40 and light-emitting diodes, both edge- and surface-emitting, are in the photo-lithographic arts and such methods and devices are useful with the present invention.

The imprinted optical micro-channel structure 5 of the present invention is useful in constructing opto-electronic systems formed on the substrate 10 and can be operated to form information processing, display, or input systems. The imprinted optical micro-channel structure 5 of the present invention is also useful in computing and communication systems.

Methods and devices for forming and providing substrates 10 and coating substrates 10 are known in the photo-lithographic arts. Likewise, tools for laying out electrodes, conductive traces, and connectors are known in the electronics industry as are methods for manufacturing such electronic system elements. Hardware controllers for controlling integrated circuits 40 and optical transceivers 42 and software for managing integrated circuits 40 and optical transceivers 42 are known. All of these tools and methods can be usefully employed to design, implement, construct, and operate the present invention. Methods, tools, and devices for operating integrated circuit and opto-electronic systems can be used with the present invention.

The present invention is useful in a wide variety of electronic devices. Such devices can include, for example, computers, communication devices, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as capacitive touch screen devices.

The invention has been described in detail with particular reference to certain embodiments thereof, but it will be understood that variations and modifications can be effected within the spirit and scope of the invention.

PARTS LIST

L length direction
5 imprinted optical micro-channel structure
10 substrate
11 substrate surface
20 cured/curable optical layer
21 layer
22 reflective layer 30 optical micro-channel
31, 31A, 31B, 31C light-pipe
32 reflective micro-channel wall
34 curved micro-channel portion
36 angled micro-channel portion
38 optical structure
40, 40A, 40B, 40C integrated circuit
42 optical transceiver
42A optical transmitter
42B optical receiver
44 electrical contact
50 light-absorbing layer
60 cured/curable electrical layer
70 electrical micro-channel
80 micro-wire
82 reflective micro-wire
100 provide substrate step
101 provide integrated circuit step
103 form light-absorbing layer
105 form curable layer step
110 imprint curable layer step
111 imprint integrated circuit structure step
115 cure curable layer step
116 form electrical layer step
117 imprint and cure electrical layer step
118 locate electrically conductive material step
119 cure electrically conductive material step
120 locate curable light-transparent material step
121 locate integrated circuit step
125 form light-pipes step
130 locate optical transmitter and receiver step
131 cure and shrink curable light-transparent material step
135 form reflective layer step
136 form reflective layer step
140 electrically connect electrical contact step
200 form cured optical layer step on substrate
201 form cured optical layer on cured electrical layer step
210 form cured electrical layer step on substrate
211 form cured electrical layer on cured optical layer step

The invention claimed is:

1. A method of making an imprinted optical micro-channel structure for transmitting light to an optical receiver or receiving light from an optical transmitter, comprising:
    forming a curable optical layer over a substrate and imprinting one or more optical micro-channels in the curable optical layer with a first stamp;
    curing the curable optical layer to form a cured optical layer having the optical micro-channels imprinted in the cured optical layer, the cured optical layer having an optical index;
    locating a curable light-transparent material in the optical micro-channels and curing the curable light-transparent material to form light-pipes of cured light-transparent material in the optical micro-channels, the cured light-transparent material in the light-pipe having an optical index greater than the optical index of the cured optical layer; and
    locating the optical transmitter in alignment with a light-pipe for transmitting light through the light-pipe or locating the optical receiver in alignment with a light-pipe for receiving light from the light-pipe.

2. The method of claim 1, further including forming a reflective layer in contact with the cured optical layer.

3. The method of claim 1, further including forming a reflective layer on walls of the optical micro-channels.

4. The method of claim 1, further including forming reflective portions of the optical micro-channels that direct light along the length of the optical micro-channels.

5. The method of claim 1, further including locating a light-absorbing layer between the cured optical layer and the substrate.

6. The method of claim 1, further including providing one or more integrated circuits having one or more optical transceivers and locating the optical transceivers in alignment with a corresponding one or more light-pipes.

7. The method of claim 1, further including treating the curable tight-transparent material in the optical micro-channels to reduce the size of the light-transparent material.

8. The method of claim 1, further including locating a reflective material in the optical micro-channels with the curable light-transparent material or curing the light-transparent material and locating a reflective material in the optical micro-channels with the cured light-transparent material.

9. The method of claim 1, further including:
    forming a curable electrical layer in contact with the cured optical layer;
    imprinting electrical micro-channels in the curable electrical layer;
    curing the curable electrical layer;
    locating a curable electrically conductive material in the electrical micro-channels; and
    curing the curable electrically conductive material in the electrical micro-channels to form a micro-wire each of the electrical micro-channels.

10. The method of claim 9, further including providing one or more integrated circuits having one or more optical transceivers and one or more electrical contacts, and electrically connecting each electrical contact to at least one micro-wire.

11. The method of claim 10, further including imprinting an impression in the curable optical layer or in the curable electrical layer and positioning the integrated circuit in the impression.

12. The method of claim 9, further including locating a cured electrical layer between the cured optical layer and the substrate.

13. The method of claim 9, further including locating the cured optical layer between a cured electrical layer and the substrate.

14. The method of claim 9, further including locating at least one micro-wire to reflect light transmitted by an optical transceiver.

15. The method of claim 14, further including locating the at least one reflective micro-wire along the length of an optical micro-channel of the optical micro-channels.

16. The method of claim 14, further including locating the at least one reflective micro-wire to reflect light from the optical transceiver to the optical micro-channels.

* * * * *